United States Patent
Eggers

(10) Patent No.: US 9,523,749 B2
(45) Date of Patent: Dec. 20, 2016

(54) MAGNETIC RESONANCE IMAGING OF CHEMICAL SPECIES

(75) Inventor: Holger Eggers, Ellerhoop (DE)

(73) Assignee: KONINKLIJKE PHILIPS ELECTRONICS N.V., Eindhoven (NL)

( * ) Notice: Subject to any disclaimer, the term of this patent is extended or adjusted under 35 U.S.C. 154(b) by 922 days.

(21) Appl. No.: 13/823,766

(22) PCT Filed: Sep. 20, 2011

(86) PCT No.: PCT/IB2011/054107
§ 371 (c)(1),
(2), (4) Date: Mar. 15, 2013

(87) PCT Pub. No.: WO2012/038886
PCT Pub. Date: Mar. 29, 2012

(65) Prior Publication Data
US 2013/0176027 A1 Jul. 11, 2013

(30) Foreign Application Priority Data

Sep. 20, 2010 (EP) .................................... 10177531
Apr. 21, 2011 (EP) .................................... 11163500

(51) Int. Cl.
G01R 33/48 (2006.01)

(52) U.S. Cl.
CPC ....... G01R 33/4818 (2013.01); G01R 33/4828 (2013.01)

(58) Field of Classification Search
CPC .................. G01R 33/4818; G01R 33/4828
See application file for complete search history.

(56) References Cited

U.S. PATENT DOCUMENTS

| | | |
|---|---|---|
| 5,144,235 A | 9/1992 | Glover et al. |
| 6,091,243 A | 7/2000 | Xiang et al. |
| 6,147,492 A | 11/2000 | Zhang et al. |
| 6,373,249 B1 | 4/2002 | Kwok et al. |
| 6,995,560 B2 | 2/2006 | Duerk et al. |
| 7,141,972 B2 | 11/2006 | Avram et al. |
| 7,196,518 B2 | 3/2007 | Yatsui et al. |
| 7,227,359 B2 | 6/2007 | Ma |

(Continued)

FOREIGN PATENT DOCUMENTS

WO    2009128764 A1    10/2009

OTHER PUBLICATIONS

An, L., et al.; Chemical Shift Imaging with Spectrum Modeling; 2001; MRM; 46:126-130.

(Continued)

*Primary Examiner* — Dixomara Vargas

(57) ABSTRACT

At least two chemical species are imaged using magnetic resonance imaging with signal separation for the two chemical species. The method includes acquiring first and second echo data at different echo times resulting in a first and second acquired complex dataset, —modelling the first and second acquired dataset, said modelling comprising a spectral signal model of at least one of the chemical species, —identifying in the first and second acquired dataset the voxels for which the modelling yields a single, unambiguous mathematical solution for the signal separation, and —resolving the ambiguity for the voxels for which the modelling yields more than one mathematical solution, if any such voxels remain.

17 Claims, 6 Drawing Sheets

(56) References Cited

U.S. PATENT DOCUMENTS

| | | | | |
|---|---|---|---|---|
| 7,741,842 B2* | 6/2010 | McKenzie | ......... | G01R 33/5611 324/306 |
| 8,030,923 B2* | 10/2011 | Yu | ..................... | G01R 33/5616 324/307 |
| 8,373,415 B2* | 2/2013 | Reeder | ............... | G01R 33/4828 324/307 |
| 8,502,536 B2* | 8/2013 | Block | ................ | G01R 33/4828 324/307 |
| 8,774,475 B2* | 7/2014 | Brendel | ............ | G01R 33/4828 382/128 |
| 8,854,038 B2* | 10/2014 | Hernando | .............. | G01R 33/50 324/307 |
| 8,957,681 B2* | 2/2015 | Hernando | .......... | G01R 33/4828 324/309 |
| 9,097,776 B2* | 8/2015 | Grodzki | ............. | G01R 33/4816 |
| 9,103,896 B2* | 8/2015 | Gross | ................ | G01R 33/5612 |
| 9,170,313 B2* | 10/2015 | Bornert | ................ | G01N 24/082 |
| 2003/0062900 A1 | 4/2003 | Kiefer et al. | | |
| 2006/0250132 A1 | 11/2006 | Reeder et al. | | |
| 2007/0285094 A1 | 12/2007 | Reeder et al. | | |
| 2008/0048657 A1 | 2/2008 | Reeder | | |
| 2008/0218169 A1 | 9/2008 | Bookwalter et al. | | |
| 2010/0052674 A1 | 3/2010 | Jellus et al. | | |
| 2010/0066365 A1 | 3/2010 | Bookwalter | | |
| 2010/0123460 A1 | 5/2010 | Hughes et al. | | |
| 2012/0316795 A1 | 12/2012 | Eggers | | |

OTHER PUBLICATIONS

Bookwalter, C. A., et al.; Fast Dixon Fat/Water Separation with Cartesian Total Sampling Time Sequence; 2006; Proc. Intl. Soc. Mag. Reson. Med.; 14:2383.

Eggers, H., et al.; Dual-echo Dixon imaging with flexible choice of echo times; 2011; MRM; 65(1)98-107.

Eggers, H.; Influence and Compensation of Fat Signal Dephasing and Decay in Two-Point Dixon Imaging; 2010; Proc. of ISMRM-ESMRMB Joint Annual Mtg.; 1 page.

Ma, J., et al.; Fast Spin-Echo Triple-Echo Dixon (fTED) Technique for Efficient T2-Weighted Water and Fat Imaging; 2007; MRM; 58:103-109.

Ma, J., et al.; Method for Efficient Fast Spin Echo Dixon Imaging; 2002; MRM; 48:1021-1027.

Ma, J., et al.; Fat-Suppressed Three-Dimensional Dual Echo Dixon Technique for Contrast Agent Enhanced MRI; 2006; Journal of Magnetic Resonance Imaging; 23:36-41.

Ma, J.; Dixon techniques for Water and Fat Imaging; 2008; Journal of Magnetic Resonance Imaging;28:543-558.

Ma, J.; Breath-Hold Water and Fat Imaging Using a Dual-Echo Two-Point Dixon Technique with an Efficient and Robust Phase-Correction Algorithm; 2004; MRM; 52:415-419.

Ren, J., et al.; Composition of adipose tissue and marrow fat in humans by 1H NMR at 7 Tesla; 2008; Journal of Lipid Research; 49:2055-2062.

Schmidt, M. A., et al.; Two-Point Dixon Fat-Water Separation: Improving Reliability and Accuracy in Phase Correction Algorithms; 2008; Journal of Magnetic Resonance Imaging; 27:1122-1129.

Szumowski, J., et al.; Double-Echo Three-Point-Dixon Method for Fat Suppression MRI; 1995; MRM; 34:120-124.

Xiang, Q-S; Two-Point Water-Fat Imaging with Partially-Opposed-Phase (POP) Acquisition: An Asymmetric Dixon Method; 2006; MRM; 56:572-584.

Yu, H., et al.; Exploiting the Spectral Complexity of Fat for Robust Multi-point Water-fat Separation; 2010; Proc. Intl. Soc. Mag. Reson. Med.; 18:771.

Yu, H., et al.; Multi-Echo Water-Fat Separation and Simultaneous R2* Estimation with Multi-Frequency Fat Spectrum Modeling; 2008; MRM; 60(5)1122-1134.

* cited by examiner

MAGNETIC RESONANCE IMAGING OF CHEMICAL SPECIES

FIELD OF THE INVENTION

The invention relates to a method of imaging at least two chemical species using magnetic resonance imaging with signal separation for two chemical species, a computer program product and a magnetic resonance imaging apparatus for imaging at least two chemical species.

BACKGROUND OF THE INVENTION

Image-forming MR methods which utilize the interaction between magnetic field and nuclear spins in order to form two-dimensional or three-dimensional images are widely used nowadays, notably in the field of medical diagnostics, because for the imaging of soft tissue they are superior to other imaging methods in many respects, they do not require ionizing radiation, and they are usually not invasive.

According to the MR method in general, the body of a patient or in general an object to be examined is arranged in a strong, uniform magnetic field $B_0$ whose direction at the same time defines an axis, normally the z-axis, of the coordinate system on which the measurement is based.

The magnetic field produces different energy levels for the individual nuclear spins in dependence on the applied magnetic field strength. These spins can be excited (spin resonance) by application of an alternating electromagnetic field (RF field) of defined frequency, the so called Larmor frequency or MR frequency. From a macroscopic point of view the distribution of the individual nuclear spins produces an overall magnetization which can be deflected out of the state of equilibrium by application of an electromagnetic pulse of appropriate frequency (RF pulse) while the magnetic field extends perpendicularly to the z-axis, so that the magnetization performs a precessional motion about the z-axis.

Any variation of the magnetization can be detected by means of receiving RF antennas, which are arranged and oriented within an examination volume of the MR device in such a manner that the variation of the magnetization is measured in a direction perpendicular to the z-axis.

In order to realize spatial resolution in the body, constant magnetic field gradients extending along the three main axes are superposed on the uniform magnetic field, leading to a linear spatial dependency of the spin resonance frequency. The signal picked up in the receiving antennas then contains components of different frequencies which can be associated with different locations in the body.

The signal data obtained via the receiving antennas correspond to the spatial frequency domain and are called k-space data. The k-space data usually include multiple lines acquired with different phase encoding. Each line is digitized by collecting a number of samples. A set of samples of k-space data is converted to an MR image, e.g. by means of Fourier transformation.

In MRI, it is often desired to obtain information about the relative contribution of two dominant chemical species, such as water and fat, to the overall signal, either to suppress the contribution of one of them or to separately or jointly analyze the contribution of both of them. These contributions can be calculated if information from two or more corresponding echoes, acquired at different echo times, is combined.

A way to obtain information on water and fat contributions to the MR signal at the same time is chemical shift encoding, in which an additional dimension, the chemical shift dimension, is defined and encoded by acquiring a couple of images at slightly different echo times.

In particular for water-fat separation, these types of experiments are often called Dixon-type of measurements. By means of Dixon imaging or Dixon water/fat imaging, a water-fat separation can be obtained by calculating contributions of water and fat from two or more corresponding echoes, acquired at different echo times. Dixon imaging usually relies on the acquisition of at least two echoes to separate water and fat signals. In general these kinds of separations are possible because there is a known precessional frequency difference of hydrogen in fat and water. In its simplest form, water and fat images are generated by either addition or subtraction of the 'in phase' and 'out of phase' datasets, but this approach is rather sensitive to main field inhomogeneities.

High quality water-fat separation with no residual fat signal in water images may be obtained in case complex models of the fat spectrum are incorporated into the water-fat separation process. This has for example been demonstrated for three-point Dixon methods in Yu H, Shimakawa A, McKenzie C A, Brodsky E, Brittain J H, Reeder S B. Multi-echo water-fat separation and simultaneous R2* estimation with multi-frequency fat spectrum modeling. Magn Reson Med 2008; 60:1122-1134.

In particular in time critical applications such as abdominal imaging in a single breath hold, two-point methods are preferably used to reduce scan times as much as possible. However, they approximate the fat spectrum by a single, dominant peak and thus in general fail to provide a more efficient fat suppression. Moreover, the quality of the fat suppression depends strongly on the choice of echo times in the image data acquisitions.

The identification of water and fat signals is desirable not only for a correct labeling or displaying of resulting images, but also for a robust separation of water and fat signals, which substantially benefits from a better initialization. However, due to inherent ambiguities between chemical shifts and main field inhomogeneities, this is challenging. For two-point Dixon imaging, an identification of water and fat signals was proposed based on a partially-opposed-phase acquisition (Xiang Q S. Two-point water-fat imaging with partially-opposed-phase (POP) acquisition: an asymmetric Dixon method. Magn Reson Med 2006; 56:572-584), exploiting the leading or lagging phase relationship between the two signals. The identification was restricted to the usually small minority of voxels which contain both water and fat, though.

For multi-point Dixon imaging, an identification of water and fat signals was suggested based on a comparison of the residuum remaining with single- and multi-peak spectral models of fat in the separation (Yu H, Shimakawa A, Brittain J H, McKenzie C A, Reeder S B. Exploiting the spectral complexity of fat for robust multi-point water-fat separation. Proc ISMRM 2010; 771). However, this approach is only robust for a higher number of points.

SUMMARY OF THE INVENTION

From the foregoing it is readily appreciated that there is a need for an improved MR imaging method. It is consequently an object of the invention to enable MR imaging in a fast and reliable manner with high quality separation of two dominant chemical species in order to determine the relative contribution of said two dominant chemical species to an acquired overall signal.

In accordance with the invention, a method of imaging at least two chemical species using magnetic resonance imaging with signal separation for two chemical species is proposed, wherein the method comprises acquiring first and second echo data at different echo times resulting in a first and second acquired complex dataset, modelling the first and second acquired dataset, said modelling comprising a spectral signal model of at least one of the chemical species, identifying in the first and second acquired dataset the voxels for which the modelling yields a single, unambiguous mathematical solution for the signal separation, and resolving the ambiguity for the voxels for which the modelling yields more than one mathematical solution, if any such voxels remain.

In other words, the present invention employs the insight to incorporate more complex models of the spectrum of at least one of the chemical species into the separation of two-point methods. It thus permits enhancing the accuracy of the signal separation for the two chemical species and the efficiency of chemical species suppression. Starting from this approach, embodiments of the present invention permit a more robust separation of the signals of the chemical species with correct assignment of the chemical species to said signals.

It has to be noted here, that in case only one of the chemical species is modelled for example by a multi-peak spectral model, the other chemical species may simply be considered as a single line. Consequently, in fact both chemical species are modelled, wherein at least one of the models comprises a multi-peak spectral model.

Further, it has to be noted that the term 'chemical species' has to be broadly understood as any kind of predefined chemical substance or any kind of nuclei of predetermined magnetic resonance properties. In a simple example, the two chemical species are the protons in the 'chemical components' water and fat. In a more sophisticated example, a multi-peak spectral model actually describes a nuclei in a set of 'chemical components', which occur in known relative amounts. In this case, the multi-peak spectral models are introduced to separate two signal components, such as the products of a chemical reaction, for instance a metabolic process. Thus, the output of a certain metabolic process may be modelled in terms of output ratios for different products. These may then be combined into a single signal component, although they are different chemical species.

Moreover, it has to be noted that, although only dual-echo data acquisitions are explicitly mentioned here, the proposed method is equally applicable to suitable subsets of multi-echo data acquisitions.

In accordance with an embodiment of the invention, the method further comprises predetermining the different echo times, wherein said predetermination comprises:

selecting or calibrating an appropriate spectral signal model of at least one of the chemical species, calculating the evolution of the amplitude and phase over echo time of the signal of at least one of the chemical species, described by time variant complex weights, selecting echo times for which these complex weights satisfy predefined constraints, by which the number of voxels for which the modelling yields more than one mathematical solution is minimized in the signal separation, and using the selected echo times for acquiring the first and second echo data resulting in the first and second acquired complex dataset.

This has the advantage that the number of voxels for which an unambiguous identification of the signals of the chemical species is maximized. Thus, the assignment of the signals acquired using the first and second echo data to the chemical species is simplified, and thus the robustness of the separation is increased.

In accordance with an embodiment of the invention, for the non identified voxels first all mathematical solutions for the signal separation are calculated by means of the modelling and then one mathematical solution is selected based on the identified voxels located in the immediate neighbourhood to said non identified voxels. For example, the modelling of the first and second acquired dataset comprises a first and second phase error for each voxel, wherein said selection of one mathematical solution is performed assuming a spatially smooth variation of the phase errors, or of the difference between the first and second phase error, in the immediate neighbourhood to said non identified voxels.

In accordance with an embodiment of the invention, the amplitude of the signal from the second chemical species decays stronger from the first to the second echo time than the amplitude of the signal from the first chemical species decays from the first to the second echo time, wherein the said predefined constraints comprise in case primarily the second chemical species is to be identified, selecting the first and second echo time such that at the first echo time the signal from the two chemical species are less in-phase than at the second echo time, and/or in case primarily the first chemical species is to be identified, selecting the first and second echo time such that at the first echo time the signals from the two chemical species are more in-phase than at the second echo time, and/or adapting the different echo times in such a way that the said relative drop in amplitude of the signal from the first to the second echo time is maximized.

This permits to ensure in advance that the number of voxels for which an unambiguous identification of the signals of the chemical species is maximized.

In accordance with an embodiment of the invention, the two chemical species are water and fat and the spectral signal model is a multi-peak spectral model of fat. Consequently the present invention does not simply assume that only one dominant spectral peak of fat is present in the spectrum but rather employs a multi-peak spectral model of fat. It is assumed that for one of the species, for example fat, the relative resonance frequencies and the relative resonance strengths are known in advance, e.g. obtained from a theoretical or experimental model, or from a separate or integrated calibration, e.g. based on the identification of pixels that contain one chemical species like fat only.

In case only one of the chemical species, for example fat, is modelled, water may be considered as a single-peak spectrum.

In case the two chemical species are water and fat, the above described predefined constraints comprise choosing a first echo time at which water and fat signals are less in-phase than at the second echo time, which generally permits an unambiguous identification of pure fat signals and/or choosing a first echo time at which water and fat signals are more in-phase than at the second echo time, which generally permits an unambiguous identification of pure water signals, or even water-dominant signals, and/or adapting the echo times in such a way that the amplitude of a pure fat signal changes as much as possible between the two echo times (according to the employed spectral model).

In accordance with a further embodiment of the invention, the method further comprises limiting the identification of voxels in the first and second acquired dataset for which the modelling yields a single, unambiguous mathematical solution for the signal separation to margins based on expected SNR and signal decay due to relaxation. Thus, in case of a poor SNR, a voxel located in a signal region having a single mathematical solution, but being close to a signal region having more than one mathematical solution is treated as a voxel for which more than one mathematical solution has to be considered. This ensures that the real mathematical solution is not accidently excluded when identifying the signals of the two chemical species with respect to said voxel.

In accordance with an embodiment of the invention, the described datasets may be image space or k-space datasets. In case image datasets are preferred, the first and second echo data may be processed for reconstruction of the first and second acquired dataset, wherein the first and second acquired datasets are image datasets in this case.

The method of the invention can advantageously be carried out in most MR devices in clinical use at present. To this end, it is merely necessary to utilize a computer program by which the MR device is controlled such that it performs the above explained method steps of the invention. The computer program may be present either on a data carrier or be present in a data network so as to be downloaded for installation in the control unit of the MR device. Therefore, the invention also relates to a computer program product comprising computer executable instructions to perform the method as described above.

Further, the invention relates to a magnetic resonance imaging apparatus for imaging at least two chemical species, the apparatus comprising a magnetic resonance imaging scanner for acquiring magnetic resonance image data, the scanner being operable for:

acquiring first and second echo data at different echo times resulting in a first and second acquired complex dataset, modelling the first and second acquired dataset, said modelling comprising a spectral signal model of at least one of the chemical species, identifying in the first and second acquired dataset the voxels for which the modelling yields a single, unambiguous mathematical solution for the signal separation, and resolving the ambiguity for the voxels for which the modelling yields more than one mathematical solutions, if any such voxels remain.

The enclosed drawing discloses a preferred embodiment of the present invention. It should be understood, however, that the drawing is designed for the purpose of illustration only and not as a definition of the limits of the invention.

DETAILED DESCRIPTION OF THE PREFERRED EMBODIMENTS

Figure 1:
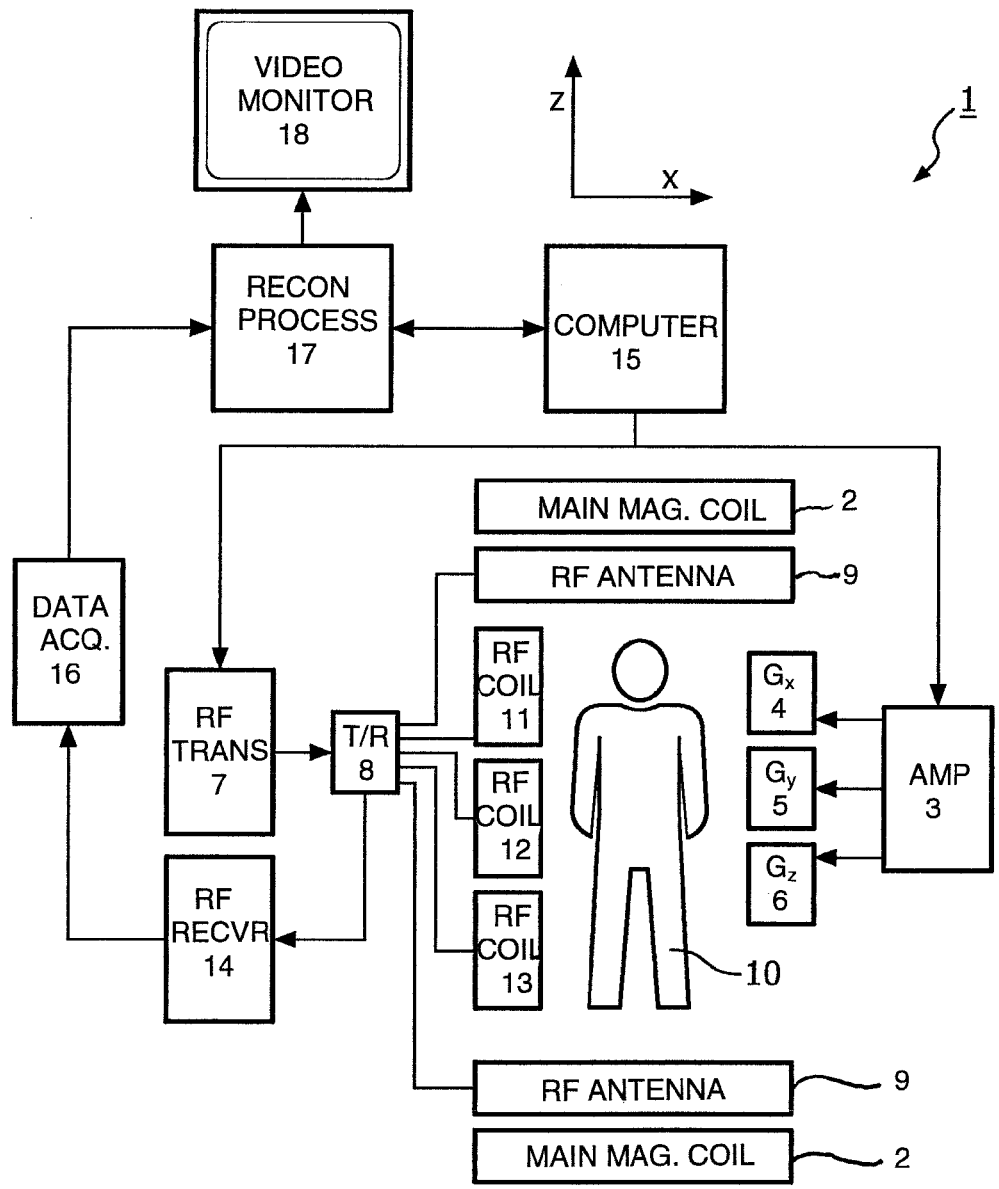
FIG. 1 schematically shows an MR imaging system.

With reference to FIG. 1, an MR imaging system 1 is shown. The system comprises superconducting or resistive main magnet coils 2 such that a substantially uniform, temporarily constant main magnetic field $B_0$ is created along a z-axis through an examination volume.

A magnetic resonance generation manipulation system applies a series of RF pulses and switched magnetic field gradients to invert or excite nuclear magnetic spins, induce magnetic resonance, refocus magnetic resonance, manipulate magnetic resonance, spatially or otherwise encode the magnetic resonance, saturate spins and the like to perform MR imaging.

More specifically, a gradient pulse amplifier 3 applies current pulses to selected ones of whole body gradient coils 4, 5 and 6 along x, y and z-axes of the examination volume. An RF transmitter 7 transmits RF pulses or pulse packets, via a send/receive switch 8 to an RF antenna 9 to transmit RF pulses into the examination volume. A typical MR imaging sequence is composed of a packet of RF pulse sequences of short duration which taken together with each other and any applied magnetic field gradients achieve a selected manipulation of nuclear magnetic resonance. The RF pulses are used to saturate, excite resonance, invert magnetization, refocus resonance, or manipulate resonance and select a portion of a body 10 positioned in the examination volume. The MR signals may also be picked up by the RF antenna 9.

For generation of MR images of limited regions of the body or in general object 10, for example by means of parallel imaging, a set of local array RF coils 11, 12 and 13 are placed contiguous to the region selected for imaging. The array coils 11, 12 and 13 can be used to receive MR signals induced by RF transmissions effected via the RF antenna. However, it is also possible to use the array coils 11, 12 and 13 to transmit RF signals to the examination volume.

The resultant MR signals are picked up by the RF antenna 9 and/or by the array of RF coils 11, 12 and 13 and are demodulated by a receiver 14 preferably including a preamplifier (not shown). The receiver 14 is connected to the RF coils 9, 11, 12 and 13 via a send/receive switch 8.

A host computer 15 controls the gradient pulse amplifier 3 and the transmitter 7 to generate any of a plurality of imaging sequences, such as echo planar imaging (EPI), echo volume imaging, gradient and spin echo imaging, fast spin echo imaging and the like. For the selected sequence, the receiver 14 receives a single or a plurality of MR data lines in a rapid succession following each RF excitation pulse. A data acquisition system 16 performs analogue to digital conversion of the received signals and converts each MR data line to a digital format suitable for further processing. In modern MR devices the data acquisition system 16 is a separate computer which is specialized in acquisition of raw image data.

Ultimately, the digital raw image data is reconstructed into an image representation by a reconstruction processor 17 which applies a Fourier transform or other appropriate reconstruction algorithms, like for example Dixon reconstruction. The MR image may represent a planar slice through the patient, an array of parallel planar slices, a three-dimensional volume or the like. The image is then stored in an image memory where it may be accessed for converting slices or other portions of the image representation into appropriate formats for visualization, for example via a video monitor 18 which provides a man readable display of the resultant MR image.

By employing the method according to the invention on the reconstruction processor 17 and the host computer 15, it is possible to exploit the amplitude modulation in the fat signal due to the partial de- and rephasing of the individual spectral peaks for an identification of the water signal, the fat signal, or both water and fat signals. Given a multi-peak spectral model of fat, it is possible to select the two echo times in two-point Dixon imaging with the aim to maximize the difference in the magnitude of the fat signal. The common two alternative solutions obtained by solving the signal equation at the two echo times are thus reduced for a broad range of signal magnitude ratios to a single, unambiguous solution.

In the following, an exemplary image reconstruction process employing the above described method shall be described in greater detail.

The composite complex signal s in image space is modeled by $$S = (W + cF)e^{i\phi},$$

where W and F denote the water and fat signals in image space, and $\phi$ and $e^{i\phi}$ denote a phase error and the corresponding phasor. The complex factor c is given by $$c = \Sigma_m w_m e^{i\theta_m},$$

where w denotes weights that add up to one and $\theta_m$ equals $2\pi\Delta f_m$ TE, with $\Delta f_m$ being the offset in resonance frequency of the m-th peak of the fat spectrum with respect to water and TE being the echo time.

Figure 2:
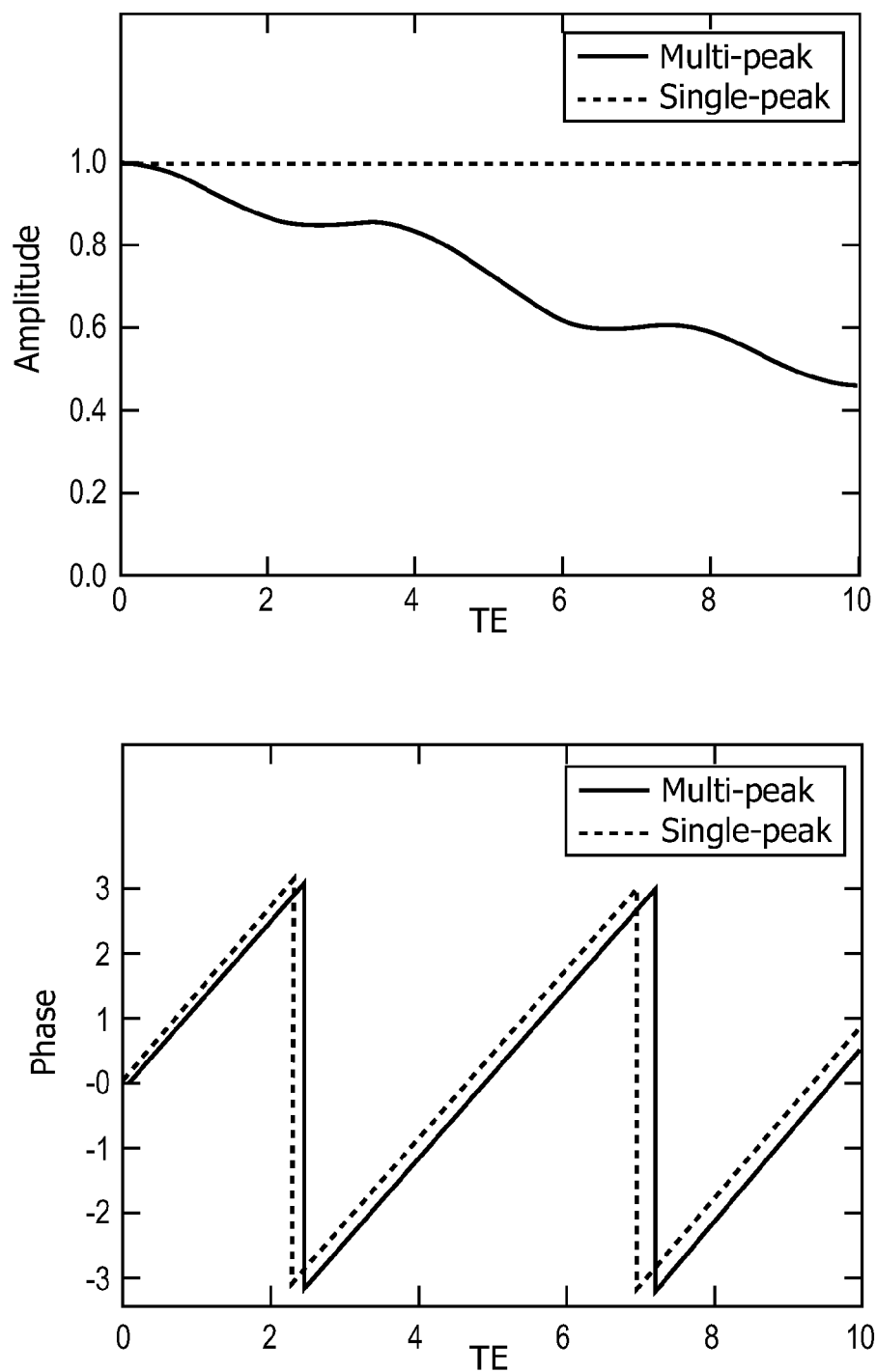
FIG. 2 illustrates the temporal variation of the complex factor c.
Figure 2:
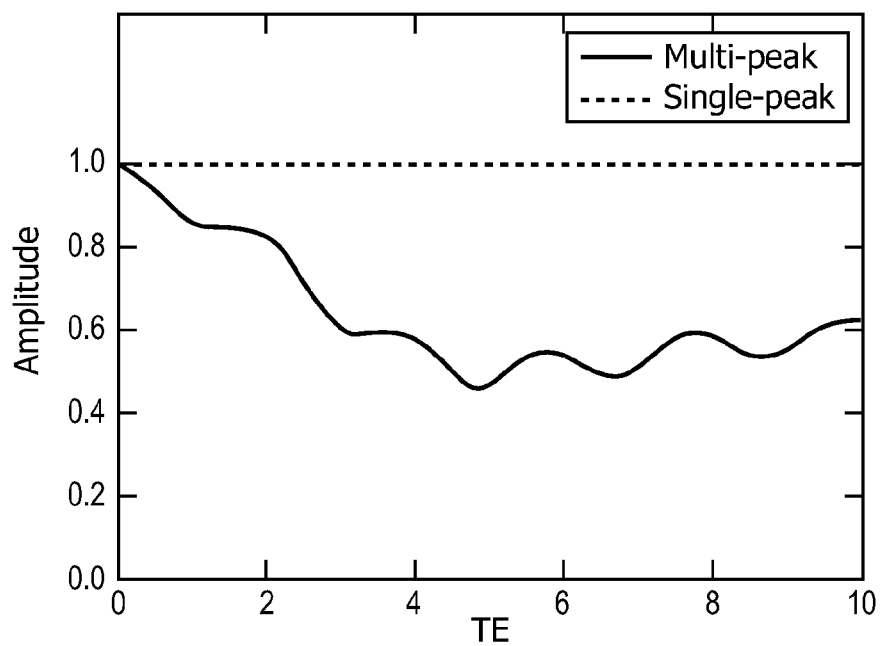
Figure 2:
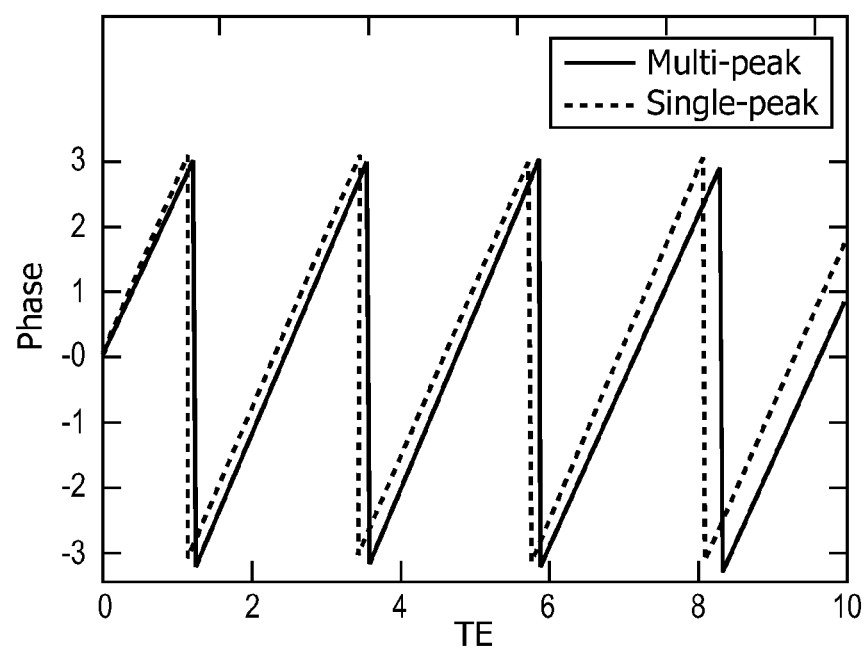

In two-point Dixon imaging, S is measured at two echo times. A separation and identification of water and fat signals is then attempted based on these samples S1 and S2. The temporal variation of the factor c, and thus of a pure fat signal, is illustrated in FIG. 2, where the amplitude (left) and phase (right) of a pure fat signal as function of the echo time (TE) is sketched, assuming a single- and a seven-peak spectral model of fat, at 1.5 T (top) and 3.0 T (bottom).

Considering that $$|S|^2 = W^2 + 2c_r WF + |c|^2 F^2,$$

it is obvious that differences in amplitude between S1 and S2 may result primarily from the fat signal itself, and not from the dephasing of water and fat signals, as previously assumed in two-point Dixon imaging. This holds in particular for very short echo times, for which the magnitude of the factor c drops rapidly.

Therefore, by a suitable choice of echo times, it is possible to exploit this amplitude modulation to resolve inherent ambiguities in the identification of water and fat signals.

Figure 3:
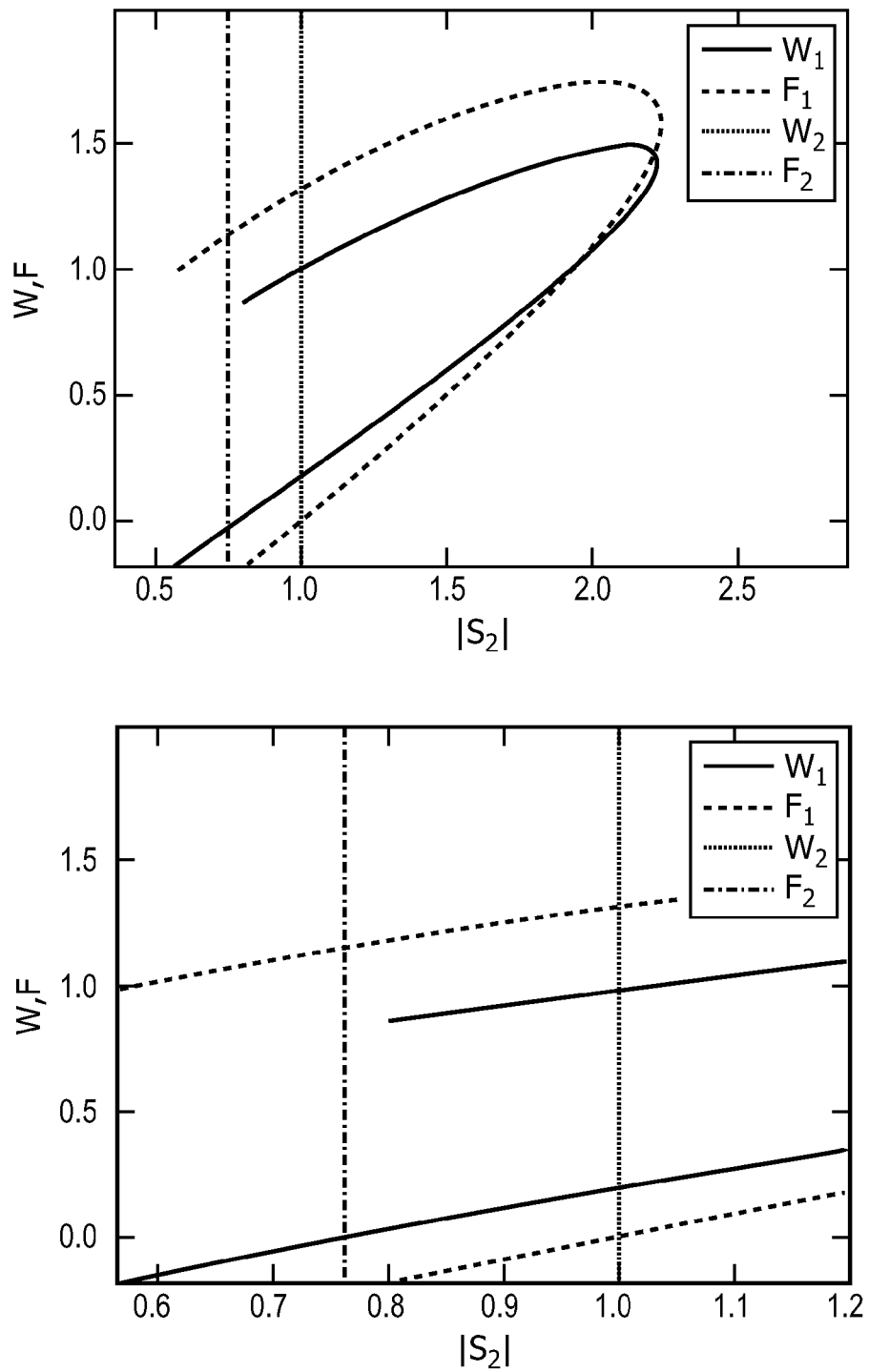
FIG. 3 shows solutions for the water signal and the fat signal.
Figure 3:
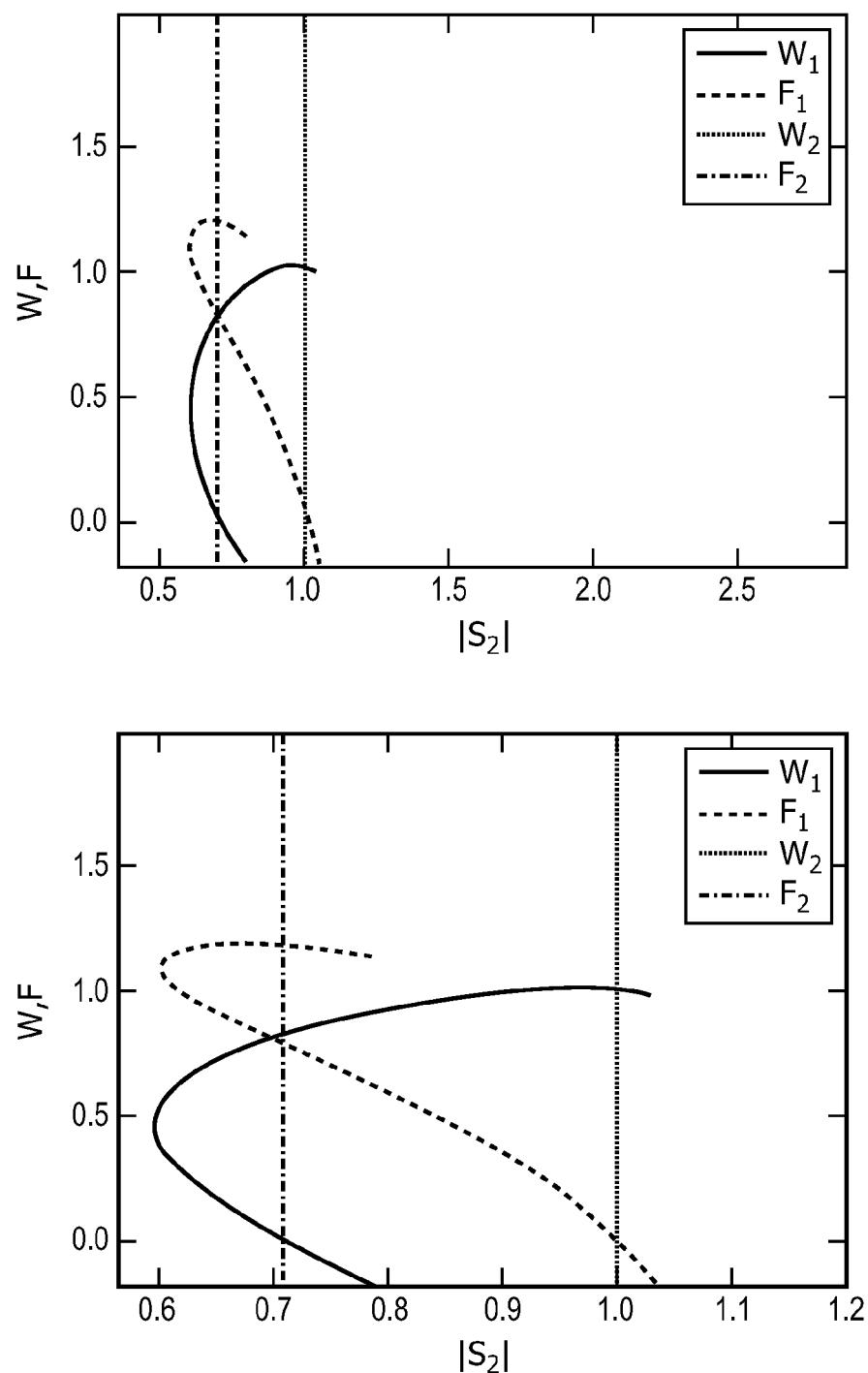

The two potential solutions obtained by solving the system of two non-linear equations $$|S_1|^2 = W^2 + 2c_{1r} WF + |c_1|^2 F^2,$$

$$|S_2|^2 = W^2 + 2c_{2r} WF + |c_2|^2 F^2,$$

are characterized in FIG. 3. Solutions for the water signal W and fat signal F as function of the amplitude of the composite signal at the second echo time $|S_2|$, for a fixed amplitude of the composite signal at the first echo time of $|S_1|=1$, are shown for $TE_1/TE_2=1.5/2.8$ ms (top) and $TE_1/TE_2=1.8/3.2$ ms (bottom). The graphs on the right are enlargements of the graphs on the left.

For very high or low values of $|S_2|$, or in general the ratio $|S_1|/|S_2|$, the potential solutions are complex. For intermediate values of this ratio, the potential solutions are real, but they may be negative. Considering all these properties, the range of values of $|S_1|/|S_2|$ is classified in FIG. 4.

Figure 4:
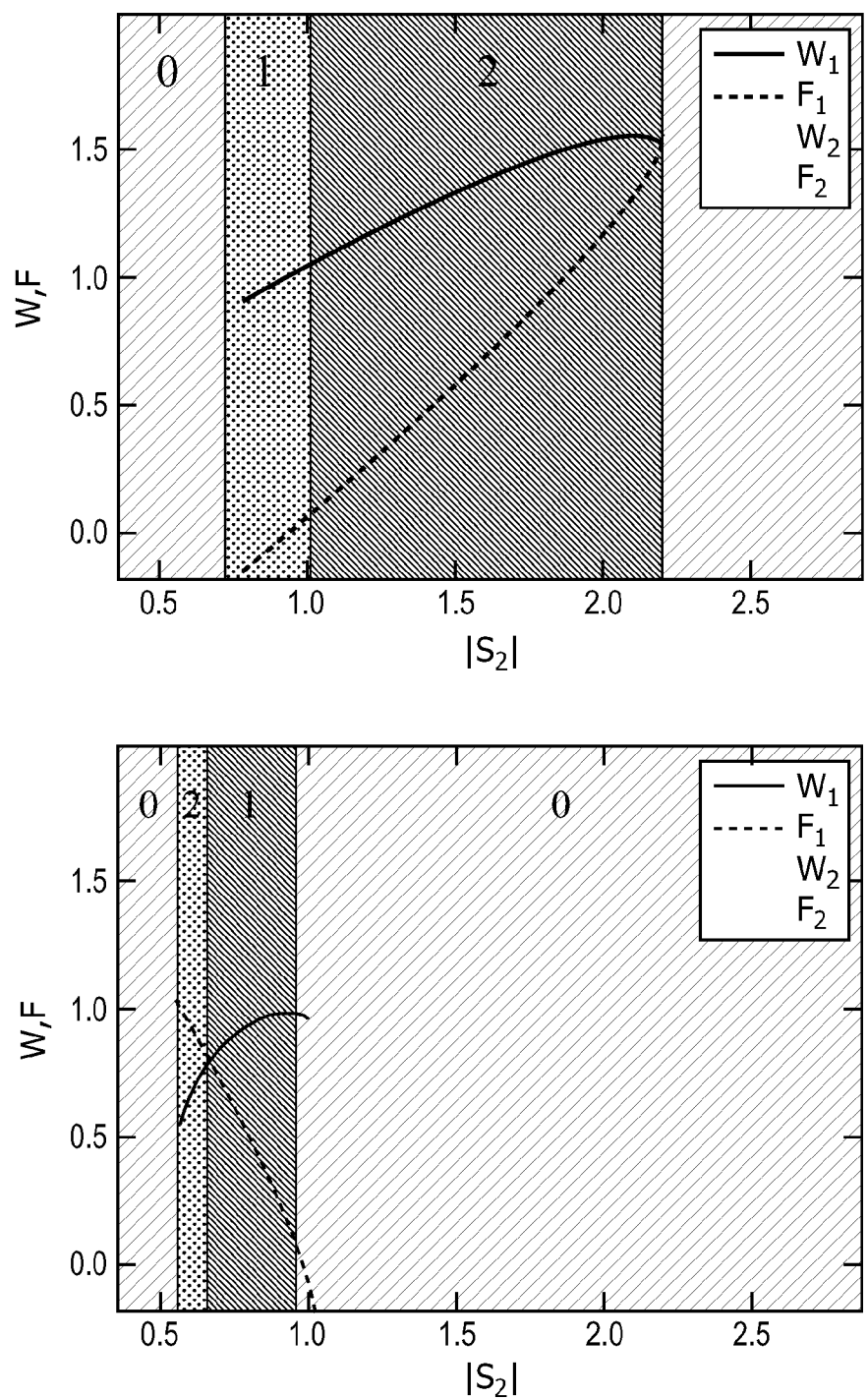
FIG. 4 illustrates a classification of the ratio of the signal amplitudes at the two echo times.

FIG. 4 illustrates a classification of the ratio of the signal amplitudes at the two echo times into three categories, according to the number of valid, i.e. non-negative real, solutions for the water and fat signals. Thus, "0" indicates that in this range of the ratio of the signal amplitudes no valid solution for the water and fat signals exists since any possible solution is either negative or complex. "1" indicates that a single possible solution for the water and fat signals exists and "2" indicates that two possible solutions for the water and fat signals exist. Thus, in region "2" an ambiguity remains, whereas in the sub-ranges classified as "1", the identification of water and fat signals is immediately achieved.

Thus, by means of FIG. 4, it is possible to identify from signal intensities in acquired image datasets the voxels for which the modelling yields a single, unambiguous mathematical solution for the water/fat signal separation.

As mentioned above, it is preferred to determine used echo times in advance in order to minimize in the signal separation the number of voxels for which the modelling yields more than one mathematical solution. This is demonstrated in a simplified manner in the following for the case of water and fat signals:

There are two obvious solutions to the system of two non-linear equations given above. The first is a pure water signal $$|S_1| = W$$

$$|S_2| = W,$$

with a signal amplitude ratio r defined by $$r = \frac{|S_1|}{|S_2|} \text{ of } r = 1.$$

The second is a pure fat signal $$|S_1| = |c_1|F$$
$$|S_2| = |c_2|F, \text{ with } r = \frac{|c_1|}{|c_2|}.$$

Other solutions are, for example, obtained by solving the first equation for W $$W = -c_{1R}F \pm \sqrt{|S_1|^2 - c_{1I}^2 F^2},$$

and inserting this expression into the second equation, yielding $$a_1 F^4 + a_2 F^2 + a_3 = 0,$$

with $$a_1 = (c_{1R}^2 - c_{1I}^2 - 2c_{1R}c_{2R} + |c_2|^2)^2 + 4(c_{1R} - c_{2R})^2 c_{1I}^2$$

$$a_2 = 2(c_{1R}^2 - c_{1I}^2 - 2c_{1R}c_{2R} + |c_2|^2)(|S_1|^2 - |S_2|^2) - 4(c_{1R} - c_{2R})^2 |S_1|^2$$

$$a_3 = (|S_1|^2 - |S_2|^2)^2$$

Obviously, $a_1$ is signal independent and $$a_1 \geq 0$$

$$a_3 \geq 0.$$

For $a_1 \neq 0$, two solutions for F are given by $$F = \sqrt{-\frac{a_2}{2a_1} \pm \sqrt{\frac{a_2^2}{4a_1^2} - \frac{a_3}{a_1}}},$$

and two further solutions for F are given by $$F = -\sqrt{-\frac{a_2}{2a_1} \pm \sqrt{\frac{a_2^2}{4a_1^2} - \frac{a_3}{a_1}}}.$$

The latter are either negative or complex and, therefore, not considered.

If the former are real, they are obviously non-negative. Consequently, it is sufficient to establish bounds for the two solutions to be real. The two necessary conditions are $$\frac{a_2^2}{4a_1^2} - \frac{a_3}{a_1} \geq 0$$

$$-\frac{a_2}{2a_1} \geq 0,$$

where the first is obvious, and the second follows from $$\sqrt{\frac{a_2^2}{4a_1^2} - \frac{a_3}{a_1}} \leq \left|\frac{a_2}{2a_1}\right|,$$

provided that the left-hand side stays real. Under these conditions, the two solutions for F are real for the same range of r. This leads to $$a_2^2 \geq 4a_1 a_3$$

$$a_2 \leq 0,$$

and thus to $$a_2 \leq -2\sqrt{a_1 a_3}.$$

For the sake of simplicity, several constants are defined $$d_1 = c_{1R}^2 - c_{1I}^2 - 2c_{1R}c_{2R} + |c_2|^2$$

$$d_2 = d_1 - 2(c_{1R} - c_{2R})^2$$

$$d_3 = d_1 + \sqrt{a_1}$$

$$d_4 = d_2 + \sqrt{a_1}$$

$$d_5 = d_1 - \sqrt{a_1}$$

$$d_6 = d_2 - \sqrt{a_1}$$

Assuming that $S_2 \neq 0$, it follows that $$2d_1(r^2-1) - 4(c_{1R}-c_{2R})^2 r^2 \leq -2\sqrt{a_1}|r^2-1|$$

and, for $r>1$, that $$d_4 r^2 \leq d_3.$$

Thus, an upper bound of $$r \leq \sqrt{\frac{d_3}{d_4}}$$

is obtained for $d_4>0$, which is at least equal to 1, since $d_3 \geq d_4$. For $d_4 \leq 0$, there are no restrictions, since $$\sqrt{a_1} \geq d_1,$$

and thus $d_3 \geq 0$. For $r=1$, there are also no restrictions. For $r<1$, it follows that $$d_6 r^2 \leq d_5,$$

with $d_6 \leq 0$. Since $d_5 \geq d_6$, there are no restrictions for $d_6=0$, while a lower bound of $$r \geq \sqrt{\frac{d_5}{d_6}}$$

is obtained for $d_6>0$, which is at most equal to 1.

Within the established bounds for real, non-negative solutions for F, the corresponding solutions for W are obtained by insertion into one of the two original equations. Alternatively, the difference between these two original equations may be used, which leads to $$2(c_{1R}-c_{2R})WF - |S_1|^2 - |S_2|^2 - (|c_1|^2 - |c_2|^2)F^2.$$

This approach has the advantage that only one solution for W results for each solution for F. However, it is only appropriate for $c_{1R} \neq c_{2R}$ and $F>0$. While the case of $F=0$ has been covered previously, the case of $c_{1R}=c_{2R}$ still needs to be analyzed. The only relevant solution for F is then $$F = \sqrt{\frac{|S_1|^2 - |S_2|^2}{c_{1I}^2 - c_{2I}^2}}$$

Insertion into the first original equation results in $$W = -c_R \sqrt{\frac{|S_1|^2 - |S_2|^2}{c_{1I}^2 - c_{2I}^2}} \pm \sqrt{\frac{|S_2|^2 c_{1I}^2 - |S_1|^2 c_{2I}^2}{c_{1I}^2 - c_{2I}^2}},$$

where $c_R = c_{1R}$ and $c_R = c_{2R}$. Both solutions for W, denoted by $W_+$ and $W_-$ in the following, also satisfy the second original equation. The conditions for these solutions to be real are $r \geq 1$ for $|c_{1I}|>|c_{2I}|$ and $r \leq 1$ for $|c_{1I}|<|c_{2I}|$, as for F, and $$r \leq \frac{|c_{1I}|}{|c_{2I}|}$$

for $|c_{1I}|>|c_{2I}|$ and $$r \geq \frac{|c_{1I}|}{|c_{2I}|}$$

for $|c_{1I}|<|c_{2I}|$.

The condition for W to be non-negative is $$\pm\sqrt{\frac{|S_2|^2 c_{1I}^2 - |S_1|^2 c_{2I}^2}{c_{1I}^2 - c_{2I}^2}} \geq -c_R \sqrt{\frac{|S_1|^2 - |S_2|^2}{c_{1I}^2 - c_{2I}^2}},$$

which leads for $c_R \geq 0$, $|c_{1I}|>|c_{2I}|$, $S_2 \neq 0$ and the + sign to $$r \leq \frac{|c_1|}{|c_2|}.$$

Similarly, potential bounds resulting in the other cases can be derived. Overall, for $c_R \geq 0$, $W_+$ is a valid solution for $$1 \leq r \leq \frac{|c_1|}{|c_2|}$$

for $|c_1|>|c_2|$ and $$\frac{|c_1|}{|c_2|} \leq r \leq 1$$

for $|c_1|<|c_2|$, while $W_-$ is invalid. For $c_R<0$, $W_+$ is a valid solution for $$1 \leq r \leq \frac{|c_{1I}|}{|c_{2I}|}$$

for $|c_1|>|c_2|$ and $$\frac{|c_{1I}|}{|c_{2I}|} \leq r \leq 1$$

for $|c_1|<|c_2|$, while $W_-$ is a valid solution for $$\frac{|c_1|}{|c_2|} \leq r \leq \frac{|c_{1I}|}{|c_{2I}|}$$

for $|c_1|>|c_2|$ and $$\frac{|c_{1I}|}{|c_{2I}|} \leq r \leq \frac{|c_1|}{|c_2|}$$

for $|c_1|<|c_2|$. Thus, in the latter intervals, two solutions exist. Assuming now that $c_{1R} \neq c_{2R}$ and $F>0$, solving for W leads to $$W = \frac{|S_1|^2 - |S_2|^2 - (|c_1|^2 - |c_2|^2)F^2}{2(c_{1R} - c_{2R})F}.$$

If F is real, so is W. For $c_{1R}>c_{2R}$, non-negative solutions for W are obtained if $$|S_1|^2 - |S_2|^2 (|c_1|^2 - |c_2|^2)F^2 \geq 0.$$

For $|c_1|>|c_2|$, this is equivalent to $$\frac{|S_1|^2 - |S_2|^2}{|c_1|^2 - |c_2|^2} \geq F^2.$$

Obviously, no such solutions exist for $r<1$. Similarly, if $c_{1R}<c_{2R}$ and $|c_1|<|c_2|$, no such solutions exist for $r<1$. By contrast, two such solutions exist for $r<1$ if $c_{1R}<c_{2R}$ and $|c_1|>|c_2|$, and for $r>1$ if $c_{1R}>c_{2R}$ and $|c_1|<|c_2|$.

By inserting the solutions for F, $$\frac{|S_1|^2 - |S_2|^2}{|c_1|^2 - |c_2|^2} \geq -\frac{a_2}{2a_1} \pm \sqrt{\frac{a_2^2}{4a_1^2} - \frac{a_3}{a_1}}$$

is obtained. With $$a_{21} = 2(c_{1R}^2 - c_{1I}^2 - 2c_{1R}c_{2R} + |c_2|^2) - 4(c_{1R} - c_{2R})^2$$

$$a_{22} = -2(c_{1R}^2 - c_{1I}^2 - 2c_{1R}c_{2R} + |c_2|^2),$$

this may be rewritten as $$\frac{|S_1|^2 - |S_2|^2}{|c_1|^2 - |c_2|^2} \geq$$

$$-\frac{a_{21}|S_1|^2 + a_{22}|S_2|^2}{2a_1} \pm \sqrt{\frac{(a_{21}|S_1|^2 + a_{22}|S_2|^2)^2}{4a_1^2} - \frac{(|S_1|^2 - |S_2|^2)^2}{a_1}},$$

$$\frac{2a_1}{|c_1|^2 - |c_2|^2}(|S_1|^2 - |S_2|^2) + a_{21}|S_1|^2 + a_{22}|S_2|^2 \geq$$

$$\pm \sqrt{(a_{21}|S_1|^2 + a_{22}|S_2|^2)^2 - 4a_1(|S_1|^2 - |S_2|^2)^2},$$

and for $|S_2| \neq 0$ as $$\frac{2a_1}{|c_1|^2 - |c_2|^2}(r^2 - 1) + a_{21}r^2 + a_{22} \geq \pm \sqrt{(a_{21}r^2 + a_{22})^2 - 4a_1(r^2 - 1)^2}.$$

Temporarily, this inequality is considered as an equation. Potential solutions are found by squaring, leading to $$\frac{4a_1^2}{(|c_1|^2 - |c_2|^2)^2}(r^2 - 1)^2 + \frac{4a_1}{|c_1|^2 - |c_2|^2}(r^2 - 1)(a_{21}r^2 + a_{22}) = -4a_1(r^2 - 1)^2.$$

Obvious solutions are $r = \pm 1$. Dividing by $a_1(r^2 - 1)$ yields $$\frac{4a_1^2}{(|c_1|^2 - |c_2|^2)^2}(r^2 - 1)^2 + \frac{4a_1}{|c_1|^2 - |c_2|^2}(a_{21}r^2 + a_{22}) = -4a_1(r^2 - 1)^2,$$

$$\left(\frac{a_1}{(|c_1|^2 - |c_2|^2)^2} + \frac{a_{21}}{(|c_1|^2 - |c_2|^2)^2} + 1\right)r^2 =$$

$$\frac{a_1}{(|c_1|^2 - |c_2|^2)^2} - \frac{a_{22}}{(|c_1|^2 - |c_2|^2)^2} + 1,$$

$$\text{and } r^2 = \frac{a_1 - a_{22}(|c_1|^2 - |c_2|^2)^2 + (|c_1|^2 - |c_2|^2)^2}{a_1 + a_{21}(|c_1|^2 - |c_2|^2)^2 + (|c_1|^2 - |c_2|^2)^2}.$$

This can be simplified to $$r^2 = \frac{4|c_1|^2(c_{1R} - c_{2R})^2}{4|c_2|^2(c_{1R} - c_{2R})^2}, \text{ and thus to } r = \pm\frac{|c_1|}{|c_2|}.$$

Consequently, there are four potential solutions for r for both $F_+$ and $F_-$, of which only the two positive ones are of interest. It remains to determine which of them are actual solutions, and in which intervals the original inequality holds.

It is easy to show that $r=\pm 1$ are actual solutions for $F_-$ only, since $a_{21}+a_{22}<0$. Inserting the other potential solutions for r into the original inequality leads to $$4(c_{1R}-c_{2R})(c_{1R}|c_2|^2-c_{2R}|c_1|^2) \geq \pm 4|c_{1R}-c_{2R}| \cdot |c_{2R}|c_1|^2-c_{1R}|c_2|^2|.$$

With this inequality, it is finally possible to determine the number of valid solutions for each r in four different cases:
Case 1: $|c_1|>|c_2|$ and $c_{1R}>c_{2R}$
a) $r<1$: no solution
b) $1 \leq r \leq |c_1/c_2|$: $F_-$, $W_-$ (i.e. a single solution)
c) $r>|c_1/c_2|$: $F_-$, $W_-$ and $F_+$, $W_+$ for $c_{1R}|c_2|^2-c_{2R}|c_1|^2>0$ (i.e. two solutions), none otherwise Consequently, for case 1 it is desired to operate with the condition $c_{1R}|c_2|^2-c_{2R}|c_1|^2<0$ such that any measurement results in a single unambiguous solution for the water/fat signal separation. Otherwise, a single unambiguous solution is usually still obtained for a water-dominant signal.
Case 2: $|c_1|>|c_2|$ and $c_{1R}<c_{2R}$
a) $r<1$: $F_-$, $W_-$ and $F_+$, $W_+$ (i.e. two solutions)
b) $1 \leq r \leq |c_1/c_2|$: $F_+$, $W_+$ (i.e. a single solution)
c) $r>|c_1/c_2|$: $F_-$, $W_-$ and $F_+$, $W_+$ for $c_{1R}|c_2|^2-c_{2R}|c_1|^2>0$, (i.e. two solutions), none otherwise Consequently, for case 2 it is again desired to operate with the condition $c_{1R}|c_2|^2-c_{2R}|c_1|^2<0$ such that a single unambiguous solution is usually obtained for a pure or almost pure fat signal. However, case 2 is generally less desirable than case 1, since only a partial identification is possible.
Case 3: $|c_1|<|c_2|$ and $c_{1R}>c_{2R}$
a) $r<|c_1/c_2|$: $F_-$, $W_-$ and $F_+$, $W_+$ for $c_{1R}|c_2|^2-c_{2R}|c_1|^2<0$, (i.e. two solutions), none otherwise
b) $|c_1/c_2| \leq r \leq 1$: $F_+$, $W_+$ (i.e. a single solution)
c) $r>1$: $F_-$, $W_-$ and $F_+$, $W_+$ (i.e. two solutions)

Consequently, for case 3 it is desired to operate with the condition $c_{1R}|c_2|^2-c_{2R}|c_1|^2>0$ such that a single unambiguous solution is usually obtained for a pure or almost pure fat signal. However, case 3 is generally less desirable than case 4, since only a partial identification is possible.
Case 4: $|c_1|<|c_2|$ and $c_{1R}<c_{2R}$
a) $r<|c_1/c_2|$: $F_-$, $W_-$ and $F_+$, $W_+$ for $c_{1R}|c_2|^2-c_{2R}|c_1|^2<0$, (i.e. two solutions), none otherwise
b) $|c_1/c_2| \leq r \leq 1$: $F_+$, $W_+$ (i.e. a single solution)
c) $r>1$: no solution Consequently, for case 4 it is desired to operate with the condition $c_{1R}|c_2|^2-c_{2R}|c_1|^2>0$ such that any measurement results in a single unambiguous solution for the water/fat signal separation. Otherwise, a single unambiguous solution is usually still obtained for a water-dominant signal.

In conclusion, cases 1 and 4 are preferred since they permit in principle a water-fat identification for the full range of r. Surprisingly, for spectral models of fat commonly applied to model the fat signal in humans, this condition is typically met when two echo times are selected at both of which the signals from water and fat are close to in-phase.

The invention claimed is:
1. A method of imaging at least two chemical species using magnetic resonance imaging with signal separation for the two chemical species, the method comprising:
   acquiring first and second echo data at different echo times resulting in a first and second acquired complex dataset;
   modelling the first and second acquired dataset, said modelling comprising a spectral signal model of at least one of the chemical species;
   identifying in the first and second acquired dataset the voxels for which the modelling yields a single, unambiguous mathematical solution for the signal separation;
   resolving the ambiguity for the voxels for which the modelling yields more than one mathematical solution, if any such voxels remain; and
   predetermining the different echo times, wherein said predetermination comprises:
      selecting or calibrating an appropriate spectral signal model of at least one of the chemical species,
      calculating the evolution of the amplitude and phase over echo time of the signal of at least one of the chemical species, described by time variant complex weights,
      selecting echo times for which these complex weights satisfy predefined constraints, by which the number of voxels for which the modelling yields more than one mathematical solution is minimized in the signal separation, and
      using the selected echo times for acquiring the first and second echo data resulting in the first and second acquired complex dataset,
   wherein for the non identified voxels find all mathematical solutions for the signal separation are calculated by means of the modelling and then one mathematical solution is selected based on the identified voxels located in the immediate neighborhood to said non identified voxels.

2. The method of claim 1, wherein the modelling of the first and second acquired dataset comprises a first and second phase error for each voxel, wherein said selection of one mathematical solution is performed assuming a spatially smooth variation of the phase errors, or of the difference between the first and second phase error, in the immediate neighborhood to said non identified voxels.

3. A non-transitory computer-readable medium carrying computer executable instructions to control a computer processor to perform the method as claimed in claim 1.

4. A magnetic resonance imaging apparatus for imaging at least two chemical species, the apparatus including:
   a magnetic resonance scanner; and
   one or more processors programmed to perform the method of claim 1.

5. One or more processors programmed to perform the method of claim 1.

6. A method of imaging at least a first and second chemical species using magnetic resonance imaging with signal separation for the first and second chemical species, the method comprising:
   acquiring first and second echo data at different echo times resulting in a first and second acquired complex datasets, wherein an amplitude of a signal from the second chemical species decays stronger from a first to a second echo time than the amplitude of the signal from the first chemical species decays from the first to the second echo time,
   modelling the first and second acquired complex datasets, said modelling comprising a spectral signal model of the first of the chemical species;
   identifying in the first and second acquired datasets the voxels for which the modelling yields a single, unambiguous mathematical solution for the signal separation;
   resolving the ambiguity for the voxels for which the modelling yields more than one mathematical solution, if any such voxels remain; and predetermining the first and second echo times, wherein said predetermining comprises:
selecting or calibrating the spectral signal model of at least one of the first and second chemical species,
calculating an evolution of amplitude and phase over the echo times of the signal of at least one of the first and second chemical species, described by time variant complex weights,
selecting the first and second echo times for which these complex weights satisfy predefined constraints, by which the number of voxels for which the modelling yields more than one mathematical solution is minimized in the signal separation, wherein the said predefined constraints comprise:
in case primarily the second chemical species is to be identified, selecting the first and second echo times such that at the first echo time the signals from the first and second chemical species are less in-phase than at the second echo time, and/or
in case primarily the first chemical species is to be identified, selecting the first and second echoes such that at the first echo time the signals from the first and second chemical species are more in-phase than at the second echo time, and/or
adapting the first and second echo times in such a way that the said relative drop in amplitude of the signal from the first to the second echo time is maximized, and
using the selected echo times for acquiring the first and second echo data resulting in the first and second acquired complex dataset.

7. The method of claim 6, wherein the first and second chemical species are water and fat and the spectral signal model is a multi-peak spectral model of fat.

8. A non-transitory computer-readable medium carrying computer executable instructions to control a computer processor to perform the method as claimed claim 6.

9. A magnetic resonance imaging apparatus for imaging at least two chemical species, the apparatus including:
a magnetic resonance scanner; and
one or more processors programmed to perform the method of claim 6.

10. One or more processors programmed to perform the method of claim 6.

11. A method of imaging at least two chemical species using magnetic resonance imaging with signal separation for the at least two chemical species, the method comprising:
acquiring first and second echo data at different echo times resulting in first and second acquired complex datasets;
modelling the first and second acquired datasets, said modelling comprising a spectral signal model of at least one of the chemical species;
identifying in the first and second acquired datasets the voxels for which the modelling yields a single, unambiguous mathematical solution for the signal separation;
limiting the identification of voxels in the first and second acquired dataset for which the modelling yields a single, unambiguous mathematical solution for the signal separation to margins based on expected SNR and signal decay due to relaxation;
predetermining the echo times, including:
selecting or calibrating the spectral signal model of at least one of the chemical species,
calculating an evolution of amplitude and phase of the signal of at least one of the chemical species, described by time variant complex weights,
selecting the echo times for which the complex weights satisfy predefined constraints, and
using the selected echo times for acquiring the first and second echo data resulting in the first and second acquired complex datasets.

12. The method of claim 11, wherein in case two chemical species are to be identified, selecting the first and second echo times such that the signals from the two chemical species are close to in-phase at both of the two echo times.

13. A non-transitory computer-readable medium carrying computer executable instructions to control a computer processor to perform the method as claimed claim 11.

14. One or more processors programmed to perform the method of claim 11.

15. A magnetic resonance apparatus for imaging at least two chemical species, the apparatus comprising a magnetic resonance imaging scanner for acquiring magnetic resonance image data, the scanner being operable for:
acquiring first and second complex echo datasets at different echo times,
modelling the first and second acquired complex datasets, said modelling comprising a spectral signal model of at least one of the chemical species,
identifying in the first and second acquired dataset the voxels for which the modelling yields a single, unambiguous mathematical solution for the signal separation, and
limiting the identification of voxels in the first and second acquired dataset for which the modelling yields a single, unambiguous mathematical solution for the signal separation to margins based on expected SNR and signal decay due to relaxation,
determining the echo times including:
selecting or calibrating the spectral signal model of at least one of the chemical species,
calculating an evolution of an amplitude and phase of the signal of at least one of the chemical species, described by time variant complex weights,
selecting echo times for which these complex weights satisfy predefined constraints, by which the number of voxels for which the modelling yields more than one mathematical solution is minimized in the signal separation, and
using the selected echo times for acquiring the first and second complex echo datasets.

16. A magnetic resonance apparatus for imaging at least first and second chemical species, comprising one or more processors configured to:
receive signals including first and second echo data at least at first and second echo times to form first and second acquired complex datasets;
select a spectral signal model $$|S_1|^2 = W^2 + 2c_{1\tau}WF + |c_1|^2 F^2,$$

$$|S_2|^2 = W^2 + 2c_{2\tau}WF + |c_2|^2 F^2,$$

where $S_1$ is an amplitude of the signal at the first echo time, $S_2$ is an amplitude of the signal at the second echo time, $W$ is a component of the signal attributable to the first chemical species and $F$ is a component of the signal attributable to the second chemical species, $c_{1\tau}$ and $c_{2\tau}$ are time variant complex weighting factors, and $c_1$ and $c_2$ are complex weighting factors;

calculate an evolution of the amplitude and phase over echo times of the signal of at least one of the first and second chemical species, described by the time variant complex weighting factors, $c_{1\tau}$, $c_{2\tau}$;

identifying in the first and second acquired datasets voxels for which the modelling yields a single, unambiguous mathematical solution for the signal separation;

selecting the echo times for which the complex weights satisfy predefined constraints, by which the number of voxels for which the modelling yields more than one mathematical solution is minimized in the signal separation;

resolve ambiguity for the voxels for which the modelling yields more than one mathematical solutions, if any such voxels remain; and control a magnetic resonance imaging scanner to acquire image data.

17. The apparatus of claim 16, wherein for the non identified voxels find all mathematical solutions for the signal separation are calculated by means of the modelling and then one mathematical solution is selected based on the identified voxels located in the immediate neighborhood to said non identified voxels.

\* \* \* \* \*